United States Patent
Shimoto et al.

(10) Patent No.: US 10,620,276 B2
(45) Date of Patent: Apr. 14, 2020

(54) MAGNETIC DETECTOR

(71) Applicant: AICHI STEEL CORPORATION, Tokai-shi, Aichi-ken (JP)

(72) Inventors: Takashi Shimoto, Aichi (JP); Jun Nakamura, Aichi (JP); Ryusuke Yamashita, Aichi (JP); Tomohiko Nagao, Aichi (JP); Michiharu Yamamoto, Aichi (JP)

(73) Assignee: AICHI STEEL CORPORATION, Tokai-shi, Aichi-ken (JP)

( * ) Notice: Subject to any disclaimer, the term of this patent is extended or adjusted under 35 U.S.C. 154(b) by 76 days.

(21) Appl. No.: 15/745,910

(22) PCT Filed: Jun. 21, 2016

(86) PCT No.: PCT/JP2016/068383
§ 371 (c)(1),
(2) Date: Jan. 18, 2018

(87) PCT Pub. No.: WO2017/022351
PCT Pub. Date: Feb. 9, 2017

(65) Prior Publication Data
US 2018/0210040 A1   Jul. 26, 2018

(30) Foreign Application Priority Data

Aug. 5, 2015 (JP) .................. 2015-155323

(51) Int. Cl.
*G01R 33/06* (2006.01)
*H01L 43/08* (2006.01)
(Continued)

(52) U.S. Cl.
CPC ........ *G01R 33/063* (2013.01); *G01R 33/0011* (2013.01); *G01R 33/02* (2013.01); *H01L 43/02* (2013.01); *H01L 43/08* (2013.01)

(58) Field of Classification Search
CPC .. G01R 33/063; G01R 33/0011; G01R 33/02; H01L 43/02; H01L 43/08
(Continued)

(56) References Cited

U.S. PATENT DOCUMENTS

2005/0242805 A1   11/2005 Honkura et al.
2011/0080164 A1   4/2011 Honkura et al.
(Continued)

FOREIGN PATENT DOCUMENTS

JP   2003-318466 A   11/2003
JP   4650591 B2   3/2011
(Continued)

OTHER PUBLICATIONS

Extended European Search Report dated Jul. 27, 2018 issued by the European Patent Office in counterpart application No. 16832630.4.
(Continued)

*Primary Examiner* — Melissa J Koval
*Assistant Examiner* — Courtney G McDonnough
(74) *Attorney, Agent, or Firm* — Sughrue Mion, PLLC

(57) ABSTRACT

A magnetic detection device that is reduced in size and thickness, but also accurate, includes a substrate and an element disposed on the substrate and including a magneto-sensitive wire sensing an external magnetic field component in an extending direction and a detection coil looping around the magneto-sensitive wire. The magnetic detection device further includes a magnetic field deflector deflecting an external magnetic field around the magneto-sensitive wire, and having a nonmagnetic material core part and a soft magnetic material shell part covering an outer side of at least part of the core part. The magnetic field deflector has a hollow, rather than solid, structure of soft magnetic material. The soft magnetic material volume is therefore significantly smaller, and the hysteresis caused in the magnetic field deflector is remarkably reduced. With the magnetic detection device, the magnetic field component orthogonal to the substrate is also detected with higher accuracy.

5 Claims, 8 Drawing Sheets

(51) Int. Cl.
  *G01R 33/02* (2006.01)
  *G01R 33/00* (2006.01)
  *H01L 43/02* (2006.01)
(58) Field of Classification Search
  USPC .......................................................... 324/244
  See application file for complete search history.

(56) References Cited

U.S. PATENT DOCUMENTS

| | | | |
|---|---|---|---|
| 2012/0013332 A1* | 1/2012 | Honkura | G01C 17/30 324/244 |
| 2012/0038358 A1 | 2/2012 | Honkura et al. | |
| 2014/0266185 A1* | 9/2014 | Sidman | G01R 33/0005 324/252 |
| 2015/0262748 A1 | 9/2015 | Nishihata et al. | |

FOREIGN PATENT DOCUMENTS

| | | |
|---|---|---|
| WO | 2005/008268 A1 | 1/2005 |
| WO | 2010/110456 A1 | 9/2010 |
| WO | 2014/054371 A1 | 4/2014 |

OTHER PUBLICATIONS

JP Notification of Reasons for Refusal of JP Patent Application No. 2015-155323 dated Aug. 9, 2016.
International Search Report of PCT/JP2016/068383 dated Aug. 16, 2016.

* cited by examiner

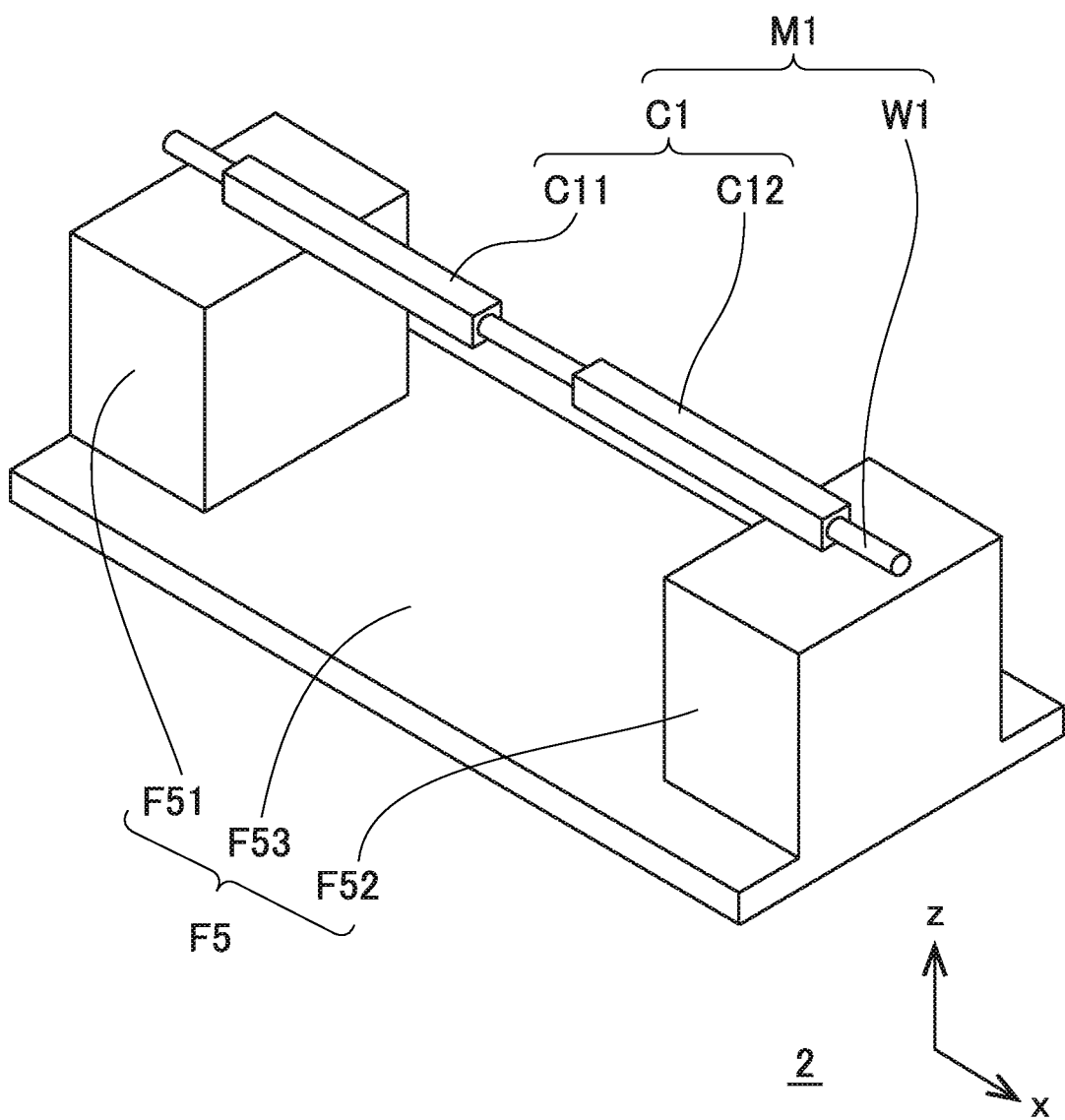

MAGNETIC DETECTOR

CROSS REFERENCE TO RELATED APPLICATIONS

This application is a National Stage of International Application No. PCT/JP2016/068383, filed Jun. 21, 2016, claiming priority based on Japanese Patent Application No. 2015-155323, filed Aug. 5, 2015, the contents of all of which are incorporated herein by reference in their entirety.

TECHNICAL FIELD

The present invention relates to a magnetic detection device (including a single body of an "MI sensor") that detects magnetism using a magneto-impedance element (referred to as an "MI element," here and hereinafter).

BACKGROUND ART

Magnetic measurement has conventionally been performed to know the orientation and the like. For example, electronic compasses and other similar devices measure a three-dimensional magnetic vector to know the accurate orientation. Measurement of the magnetic vector is performed by a magnetic sensor. Examples of such magnetic sensors include Hall elements and MR elements. In recent years, MI elements are focused on, which are entirely different in the structure and principle from such conventional elements and have incomparably high sensitivity.

MI elements utilize a magneto-impedance effect (referred to as an "MI effect") that, when a high frequency pulse current or the like is caused to flow through a magneto-sensitive wire such as an amorphous wire, its impedance varies in accordance with a magnetic field due to a skin effect. Magnetic measurement of an external magnetic field and the like is possible by directly measuring the impedance variation and/or by indirectly measuring the variation of amount of magnetic flux generated in the magneto-sensitive wire, which causes the MI effect, via a detection coil (pickup coil) wound around the magneto-sensitive wire.

It should be noted, however, that MI elements can basically detect only a magnetic field component in the direction in which the magneto-sensitive wire extends. Therefore the conventional MI sensor, as in Patent Literature 1, has to be provided with an individual MI element for each of components of the magnetic vector to detect. For example, when measuring the three-dimensional components of an external magnetic field, it may be necessary to provide an MI element for X-axis and an MI element for Y-axis on the substrate plane (X-Y plane) and an MI element for Z-axis in the orthogonal direction to the substrate plane. This MI element for Z-axis has a certain length in the Z-axis direction like the other MI elements because of its structure. Accordingly, the conventional three-dimensional magnetic detection device is intrinsically difficult to be reduced in size and thickness in the Z-axis direction.

Nowadays, however, MI sensors incorporating MI elements have already been built in various handheld information terminals, etc. and are required to have high performance (high sensitivity and high accuracy) and to be further reduced in size. To this end, Patent Literature 2 proposes to omit the MI element for Z-axis and allow the MI element for X-axis and the MI element for Y-axis to measure the magnetic field component in the Z-axis direction.

PRIOR ART LITERATURE

Patent Literature

[Patent Literature 1] WO2005/008268
[Patent Literature 2] WO2010/110456

SUMMARY OF INVENTION

Problems to be Solved by the Invention

In the magnetic detection device of Patent Literature 2, for example, a pair of MI elements for X-axis opposing each other and another pair of MI elements for Y-axis opposing each other are orthogonally arranged, a solid magnetic field deflector of a soft magnetic material (such as permalloy) is provided at the center of the MI elements, and a detection voltage obtained from each MI element is calculated thereby to enable detection of a magnetic field component in the Z-axis direction without using an MI element for Z-axis. This may allow the magnetic detection device of Patent Literature 2 to be significantly reduced in size. Fortunately, intensive studies by the present inventors have revealed that a magnetic detection device can be further reduced in size and can have higher accuracy, further improved productivity, etc.

The present invention has been made in view of such circumstances and an object of the present invention is to provide a magnetic detection device that can be further reduced in size and production cost and can have higher accuracy, further improved productivity, etc.

Means for Solving the Problems

As a result of intensive studies to achieve the above object and repeating trial and error, the present inventors have conceived of modifying the magnetic field deflector used in a conventional magnetic detection device from the solid structure of a soft magnetic material to a hollow structure (shell structure). Developing this achievement, the present inventors have accomplished the present invention.

«Magnetic Detection Device»

(1) That is, the magnetic detection device of the present invention comprises a substrate and a magneto-impedance element (referred to as an "MI element") disposed on the substrate and comprising a magneto-sensitive wire and a detection coil. The magneto-sensitive wire senses an external magnetic field component in an extending direction. The detection coil loops around the magneto-sensitive wire. The magnetic detection device further comprises a magnetic field deflector of which at least a part is disposed on the substrate or in the substrate. The magnetic field deflector deflects an external magnetic field around the magneto-sensitive wire. The magnetic field deflector comprises a core part composed of a nonmagnetic material and a shell part composed of a soft magnetic material. The shell part covers an outer side of at least a part of the core part.

(2) The magnetic field deflector according to the present invention has the shell part composed of a soft magnetic material which covers the outer side of at least a part of the core part composed of a nonmagnetic material. This shell part deflects the external magnetic field existing around the magneto-sensitive wire. The magneto-sensitive wire can therefore detect an external magnetic field component that is orthogonal to the magneto-sensitive wire.

The magnetic field deflector (in particular, the shell part) according to the present invention is composed of a hollow body (shell structure) rather than a solid body of a soft magnetic material. The volume of a soft magnetic material to be used can therefore be very small. This can considerably reduce the hysteresis caused in the magnetic field deflector (in particular, the shell part) according to the present invention. As a consequence, the magnetic field deflector according to the present invention is excellent in the followability to a varying magnetic field component. Thus, the magnetic detection device of the present invention is excellent in the accuracy (in particular, linearity) when detecting the external magnetic field (in particular, the magnetic field component orthogonal to the magneto-sensitive wire).

Moreover, the shell part according to the present invention can be formed in a short period of time by plating or the like of a soft magnetic material using photolithography because it is enough for the shell part to be even in a thin film-like shape. The magnetic detection device of the present invention is therefore excellent in the improvement of productivity and/or the reduction in production cost.

If a magnetic field deflector of a solid structure is formed by long-time plating and the like, strain (stress) may readily be introduced into the magnetic field deflector. In contrast, the shell part according to the present invention is thin and can be formed in a short period of time, and the amount of introduced strain is small. It can therefore be said that the hysteresis due to strain and the like is less likely to occur in the magnetic field deflector (in particular, the shell part) according to the present invention even without performing some heat treatment. Thus, according to the magnetic detection device of the present invention, it is possible to achieve both the improvement in detection accuracy and the improvement in production efficiency or the reduced cost, etc.

«Others»

The "detection coil" as referred to in the present description may be obtained by actually winding a wire, but may preferably be configured using a wiring pattern formed by photolithography and the like because in this case the magnetic detection device can be further reduced in thickness and size.

The "deflection" and its derivatives as used in the present description refer to changing the direction of a magnetic field component that is not sensed by the magneto-sensitive wire to a direction in which the magneto-sensitive wire can sense it. This allows the magneto-sensitive wire to detect at least a part of the magnetic field component which would not be sensed by the magneto-sensitive wire under ordinary circumstances.

The "external magnetic field" as referred to in the present description is a magnetic field (environmental magnetic field) that acts on the magnetic detection device from the external and is to be a substantial detection object by the magnetic detection device. The "measurement magnetic field" refers to a magnetic field that is actually sensed by the magneto-sensitive wire and detected or measured by the MI element, among external magnetic fields affected by the magnetic field deflector.

In the present description, the "first," "second," "third," "one," "another (other)," "one surface side," "another (other) surface side," "left-side," "right-side," "X-axis (direction, component)," "Y-axis (direction, component)," "Z-axis (direction, component)," and the like may be used for descriptive purposes to distinguish each member and each part. Unless otherwise stated, these terms do not have special meanings, such as priority order. The direction of a magnetic field component detected by the magneto-sensitive wire may be referred to as a "one axis direction" (extending direction of the magneto-sensitive wire) while the direction of a magnetic field component that is deflected by the magnetic field deflector and detected by the magneto-sensitive wire in the one axis direction may be referred to as another (other) axis direction.

BRIEF DESCRIPTION OF DRAWINGS

FIG. 6C is a perspective view schematically illustrating substantial parts of the MI sensor.

EMBODIMENTS FOR CARRYING OUT THE INVENTION

Figure 1:
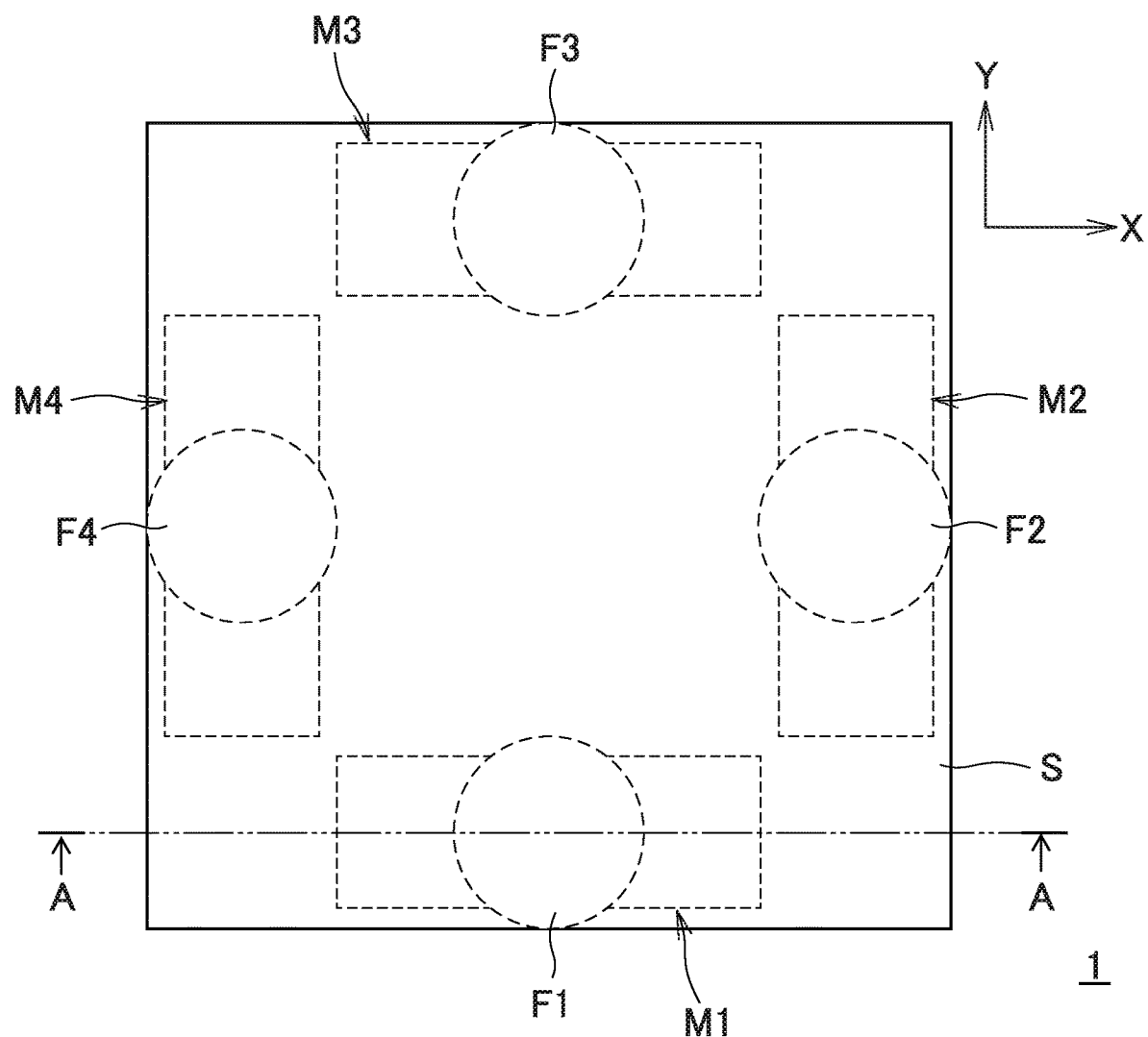
FIG. 1 is a plan view illustrating the overview of an MI sensor according to a first example.

One or more features freely selected from the present description can be added to the above-described features of the present invention. The contents described in the present description can be applied not only to the magnetic detection device of the present invention but also to a method of manufacturing the same. In a certain case (when there is a situation where it is impossible or utterly impractical to directly specify a "product" by its structure or characteristics (impossible/impractical circumstances) or the like), features regarding a production process can also be features regarding the "product" when understood as those in a product-by-process. Which embodiment is the best or not is different in accordance with objectives, required performance, and other factors.

«MI Element»

The MI element according to the present invention has a magneto-sensitive wire that can sense magnetism such as an external magnetic field to generate the impedance variation and/or the variation of amount of magnetic flux and a detection coil as a detection means that detects the amount of variation in the magneto-sensitive wire. The magneto-sensitive wire is composed, for example, of a wire (wire rod) or thin film that is formed of a soft magnetic material and has an appropriate length. In particular, an amorphous wire of zero magnetostriction is preferred as the magneto-sensitive wire in view of the sensitivity, cost, and the like. This amorphous wire is a wire of Co—Fe—Si—B-based alloy having a diameter of 1 to 30 μm, for example, and details thereof are described in JP4650591B, etc.

The magneto-sensitive wire may be provided in contact with the equipping surface, provided above the equipping surface via an insulator or the like, or provided to be embedded in a groove or the like. It suffices that the detection coil loops around the magneto-sensitive wire in accordance with such an arrangement form of the magneto-sensitive wire, but forming the magneto-sensitive wire using photolithography is preferred because the MI element can be reduced in thickness and size.

The MI element according to the present invention may not necessarily have to be utilized for detection of the magnetic field component in the one axis direction in which the MI element extends, provided that the MI sensor is utilized for detection of the magnetic field component in the other axis direction. In consideration of reduction in the thickness, size, cost, and the like of the magnetic detection device, however, it is preferred that one MI element can detect magnetic field components in the both axis directions.

«Magnetic Field Deflector»

The magnetic field deflector deflects the magnetic field component in the other axis direction, which intersects with the substrate provided with the magneto-sensitive wire, to the extending direction of the magneto-sensitive wire (the one axis direction). The magnetic field deflector according to the present invention is not a solid body of a soft magnetic material and comprises a core part that is composed of a nonmagnetic material and a shell part that is composed of a soft magnetic material and that covers the outer side of at least a part of the core part. Various forms of the shell part or core part may be considered, provided that the magnetic field component in the other axis direction is detected by the magneto-sensitive wire which extends in the one axis direction.

For example, the core part is preferably in a column-like shape or circular cone-like shape that extends in a direction orthogonal to the magneto-sensitive wire. In an embodiment, at least a part of the shell part is preferably formed on the top surface of the core part, that is, the end surface at the magneto-sensitive wire side (side nearest to the magneto-sensitive wire). Such a core part and shell part can be highly accurately and efficiently formed using photolithography and the like. Moreover, the shell part is formed at least on the top surface, and the magnetic field component in the other axis direction is thereby stably deflected to the extending direction of the magneto-sensitive wire (the one axis direction), thus allowing the magneto-sensitive wire to readily detect the magnetic field component in the other axis direction.

The nonmagnetic material which constitutes the core part of the magnetic field deflector is a material having lower magnetic characteristics (magnetic permeability, saturated magnetization, or magnetic susceptibility) than those of the soft magnetic material which constitutes the shell part. Suffice it to say that the nonmagnetic material may be a material that does not exhibit ferromagnetism (ferromagnetic property) (in particular, a material that exhibits paramagnetism), such as an (insulating) resin, nonmagnetic metal (copper, aluminum or alloys thereof, etc.), and ceramics. Provided that the shell part can be formed, the core part may be a cavity, but is ordinarily formed as a solid body of an insulating resin or metal for wiring (Cu, Al, etc.) that constitutes a part of the substrate on which the MI element is equipped.

As the soft magnetic material which constitutes the shell part of the magnetic field deflector has a higher magnetic permeability, it is more preferred because the effect of collecting magnetism is higher. For example, it is preferred to use a ferromagnetic material such as permalloy, pure Ni, pure iron, sendust, and permendur. The shell part is preferably formed to have a uniform thickness on the whole or a part of the outer surface of the core part which may be a solid body. When the shell part is formed on a part of the outer surface of the core part, the shell part is preferably located at least in a region (e.g. the top surface) that is close to the magneto-sensitive wire, as previously described. Depending on the arrangement of the MI element and the magnetic field deflector, when the shell part is formed symmetrically at least with respect to the extending direction of the MI element, detection of the magnetic field component in the other axis direction and the calculation processing on the detection results can be readily performed, which may be preferred.

The magnetic field deflector according to the present invention is preferably provided with a magnetism collecting part that magnetically collects the magnetic field component in the other axis direction, in addition to the core part and the shell part. It is preferred for the magnetism collecting part to be expanded at a far side from the magneto-sensitive wire and merge into the shell part which is located at a near side to the magneto-sensitive wire. In an embodiment, the magnetism collecting part may be a bridging body (bridging part) that bridges a plurality of shell parts. By providing such a magnetism collecting part, it is easy to detect the magnetic field component in the other axis direction with high sensitivity and expand the measurement range.

«Magnetic Detection Device»

(1) It suffices for the magnetic detection device of the present invention that the whole or a part of the magnetic field deflector has a shell structure. Various types are therefore considered for the arrangement relationship and number of MI elements and magnetic field deflectors, etc. For example, possible types of the magnetic detection device of the present invention are considered as below. In any case, to facilitate the detection of the magnetic field component in the other axis direction and the calculation processing on the detection results, the shell part of the magnetic field deflector is preferably formed symmetrically with respect to one or more MI elements.

The first possible type refers to a case in which the detection coil comprises a left-side coil part and a right-side coil part that coexist along the magneto-sensitive wire and the magnetic field deflector is disposed on the middle of the left-side coil part and the right-side coil part.

In this case, even without providing a pair of MI elements, one MI element can detect the magnetic field component in the other axis direction (and further perform calculation processing on the detection results) on the basis of the left-side output obtained from the left-side coil part and the right-side output obtained from the right-side coil part. This allows suppression of the height in the direction intersecting the substrate of the magnetic detection device (height in the third axis direction). Moreover, the degree of freedom in arranging the MI element and the degree of freedom in designing the magnetic detection device are enhanced and the magnetic detection device can readily be further reduced in the thickness and size and further enhanced in the performance.

Detection of the magnetic field components in two directions by one MI element can be easily performed by switching the calculation which uses the left-side output and the right-side output. For example, when the left-side coil part and the right-side coil part have the same number of turns, the difference or sum of the left-side output and right-side output may be switched for calculation in accordance with winding directions of the left-side coil part and right-side coil part thereby to enable detection of both the magnetic field component in the one axis direction and the magnetic field component in the other axis direction. More specifically, when the winding directions of the left-side coil part and right-side coil part are the same, the magnetic field component in the other axis direction can be detected on the basis of the difference between the left-side output and the right-side output, while the magnetic field component in the one axis direction can be detected on the basis of the sum of the left-side output and right-side output. When the winding directions (or wiring methods) of the coil parts are reversed, the calculations of the outputs can be reversely performed to obtain the same results. Thus, the magnetic detection device of the present invention is preferably provided with a calculation circuit that detects the magnetic field component in each direction on the basis of the output from each coil part. In an embodiment, this calculation circuit preferably includes a switching circuit that switches between the difference and the sum of the left-side output and right-side output to enable detection of both the magnetic field component in the one axis direction (first axis direction) and the magnetic field component in the other axis direction (third axis direction).

The second possible type refers to a case in which the detection coil comprises a left-side coil part and a right-side coil part that coexist along the magneto-sensitive wire and the magnetic field deflector comprises a left-side deflecting part disposed near the left-side coil part side and a right-side deflecting part disposed near the right-side coil part side.

In this case, a part of the extending component (magnetic field component in the extending direction of the magneto-sensitive wire) of the external magnetic field enters one of the left-side deflecting part and the right-side deflecting part and exits from the other so as to circumvent the magneto-sensitive wire. The extending component passing through the magneto-sensitive wire is therefore reduced. As a consequence, the measurement range of the magneto-sensitive wire and thus of the MI element is expanded as compared with the case in which the magnetic field deflector as the above is not provided. Moreover, each component of the external magnetic field can be measured in a wide range while ensuring appropriate sensitivity because it is possible to adjust the balance between the extending component and the orthogonal component, which are introduced into the magneto-sensitive wire, by adjusting the arrangement and size of the left-side deflecting part or the right-side deflecting part.

Preferably, the magnetic field deflector further has a bridging part that bridges the left-side deflecting part and the right-side deflecting part at a far side from the magneto-sensitive wire. In this case, the left-side deflecting part, the bridging part, and the right-side deflecting part serve as a yoke to form a magnetic circuit in which the magnetic field component entering one of the left-side deflecting part and the right-side deflecting part passes through the bridging part and exits from the other of the left-side deflecting part and the right-side deflecting part. Moreover, the bridging part also serves as the previously-described magnetism collecting part so that more orthogonal components are magnetically collected and introduced into the magneto-sensitive wire, which can contribute to enhancing the sensitivity of the magnetic detection device.

The third possible type refers to a case in which the magneto-sensitive wire comprises a first wire and a second wire that are disposed parallel to each other, the detection coil comprises a first coil that loops around the first wire and a second coil that loops around the second wire, and the magnetic field deflector comprises a first deflecting body disposed near one end part side of the first wire and a second deflecting body disposed near the other end part side of the second wire.

In this case, as in the above-described second type, a part of the extending component of the external magnetic field is deflected by the first deflecting body and the second deflecting body so as to circumvent the magneto-sensitive wire. The extending component passing through the magneto-sensitive wire is therefore reduced, and the measurement range of the MI element can be expanded as compared with the case in which the magnetic field deflector is not provided.

In the case of the second type, magnetic poles are formed not only in both end parts of the magneto-sensitive wire but also in the middle of the magneto-sensitive wire (e.g., S-poles are formed in the both end parts while N-poles are formed in the middle). In contrast, in the case of the third type, magnetic poles (N-pole and S-pole) are merely formed in respective end parts of the magneto-sensitive wire. In the case of the third type, therefore, the distance between magnetic poles formed in the magneto-sensitive wire is longer than that in the case of the second type and, accordingly, effects of the demagnetizing field in the magneto-sensitive wire can be suppressed. Thus, provided that the lengths of the magneto-sensitive wires are the same, the magnetic field component can be detected with higher sensitivity in the case of the third type than the case of the second type.

Moreover, in the case of the third type, one or more pairs of magneto-sensitive wires and detection coils are provided. The detection output is therefore about twice as high to the magnetic field component in the same direction, and sensitivity of the magnetic detection device can readily be enhanced. Also in the case of the third type, the magnetic field deflector preferably has a bridging body that bridges the first deflecting body and the second deflecting body at a far side from the first wire and the second wire. This bridging body can also serve as a yoke and serve as a magnetism collecting part as in the bridging part of the second type.

(2) When three-dimensional components (e.g. X-component, Y-component, and Z-component) of the external magnetic field are detected, the magnetic detection device of the present invention may be provided with at least one MI element on the substrate to detect the magnetic field component in a second axis direction (e.g. Y-axis direction) that is different from the first axis direction (one axis direction, e.g. X-axis direction). That is, the magnetic detection device of the present invention is preferably further provided with a second MI element that is disposed on the substrate and comprises a second magneto-sensitive wire and a second detection coil. The second magneto-sensitive wire extends in the second axis direction different from the first axis direction and senses the magnetic field component in the second axis direction. The second detection coil loops around the second magneto-sensitive wire.

The second MI element may not necessarily have to detect the magnetic field component in the other axis direction (third axis direction, e.g. Z-axis direction). When, however, the second MI element can independently detect the magnetic field component in the other axis direction like the first MI element, both detection results can be utilized to accurately detect the magnetic field component in the other axis direction. In the magnetic detection device of the present invention, a plurality of the first MI elements which detect the magnetic field component in the first axis direction and/or a plurality of the second MI elements which detect the magnetic field component in the second axis direction may be disposed on the substrate. Even when one MI element cannot obtain sufficient sensitivity, the plurality of MI elements may be provided to obtain a higher output, thus enhancing the sensitivity.

The MI element or elements and the magnetic field deflector or deflectors may be disposed, for example, only at one surface side of the substrate or at both surface sides of the substrate or may also be disposed in the substrate. A single magnetic field deflector or a plurality of magnetic field deflectors may be provided for one MI element or a pair of MI elements. When a plurality of magnetic field deflectors is provided, the form and size of the magnetic field deflectors may be the same or different. When a plurality of magnetic field deflectors is provided for one MI element or a pair of MI elements, they are preferably arranged in a symmetric form. In an alternative embodiment, a plurality of MI elements or plural pairs of MI elements may share one or more magnetic field deflectors.

(3) The magnetic detection device of the present invention may be an MI sensor comprising one or more MI elements or may also be an information terminal, measurement apparatus, or the like comprising the MI sensor. The magnetic detection device of the present invention may preferably include, in addition to the MI element comprising the magneto-sensitive wire and the detection coil, a pulse oscillation circuit that supplies a high-frequency voltage (current) to the magneto-sensitive wire, a signal processing circuit that samples and outputs the detected voltage obtained from the detection coil (in particular, each coil part), a calculation circuit that performs calculation on the basis of such outputs to calculate the magnetic field component in each direction, and other necessary circuits. In particular, when the magnetic detection device of the present invention is an MI sensor, these circuits are preferably formed as an integrated circuit (drive circuit) in the substrate on which the MI element is mounted because in this case the MI sensor can be reduced in the thickness and size. Mounting of the MI element to the substrate may be performed by wire bonding or flip-chip bonding, in particular using a wafer-level chip size package (CSP), which may be preferred for further reducing the thickness and size of the MI sensor.

«Method of Manufacturing Magnetic Detection Device»

The magnetic detection device of the present invention can be obtained through a process in which the MI element is mounted on an embedding base substrate, in which the magnetic field deflector is embedded, so as to correspond to the arrangement of the magnetic field deflector. The embedding base substrate may be obtained using photolithography and the like through a process of forming the magnetic field deflector and a process of forming a resin layer in which the magnetic field deflector is embedded. The magnetic field deflector may be formed through a process of forming a core part composed of a nonmagnetic material (such as resin or copper) and a process (e.g. plating process) of forming a shell part composed of a soft magnetic material on the outer surface of the core part.

In an ordinary case, small-sized magnetic detection devices (MI sensors) may be efficiently manufactured by dividing (dicing) a mounting substrate obtained such that a number of MI elements are mounted on the embedding base substrate in which a number (plurality) of magnetic field deflectors are embedded.

EXAMPLES

First Example

<Device Overview>

Figure 2A:
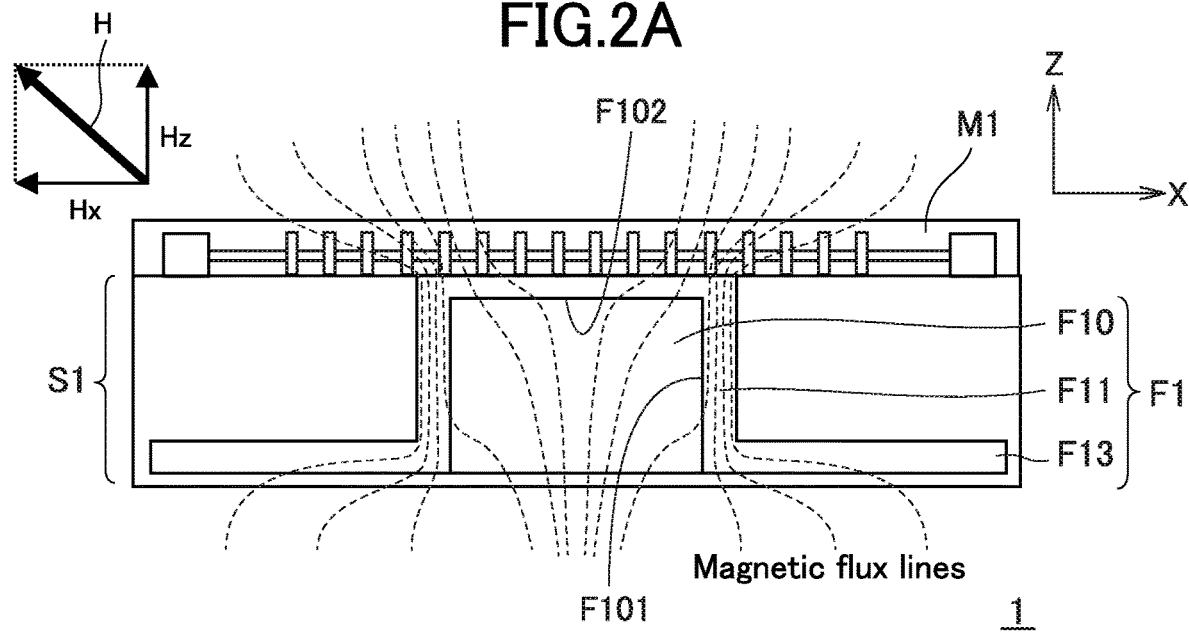
FIG. 2A is a view illustrating an A-A partial cross section illustrated in the plan view and magnetic flux lines in the Z-axis direction which act thereon.
Figure 2B:
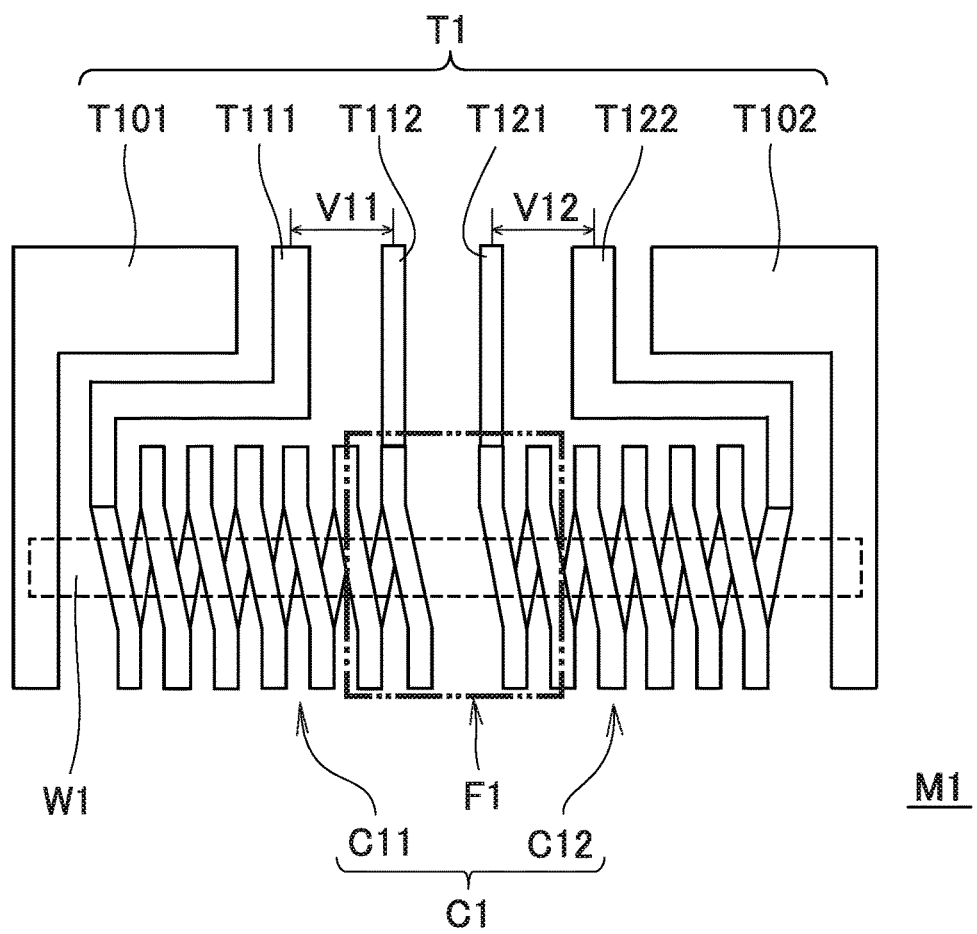
FIG. 2B is a plan view of an MI element that constitutes a part of the MI sensor.

FIG. 1 illustrates the overview (plan view) of an MI sensor module 1 (referred simply to as an "MI sensor 1") as a first example according to the magnetic detection device of the present invention. FIG. 2A illustrates a partial cross-sectional view along line A-A illustrated in FIG. 1 and magnetic flux lines in the Z-axis direction (the other axis direction, third axis direction) which act on the MI sensor 1. FIG. 2B is a detailed plan view of a portion illustrated in FIG. 2A.

The MI sensor 1 has four MI elements M1 to M4 that detect an external magnetic field such as geomagnetism, magnetic field deflectors F1 to F4, and a circuit substrate S (corresponding to the "substrate" as referred to in the present invention) on which the MI elements M1 to M4 are equipped and in which the magnetic field deflectors F1 to F4 are embedded.

The circuit substrate S is formed therein with an integrated circuit (ASIC: application specific integrated circuit) that includes a pulse oscillation circuit (drive circuit) necessary to drive each MI element, a signal processing circuit, a calculation circuit, and other necessary circuits. Although not described in detail, each MI element and the integrated circuit in the circuit substrate S are electrically connected via bumps. This realizes a wafer-level CSP without wire bonding. Unless otherwise stated, each circuit and other components are formed by photolithography.

The MI elements M1 to M4 are mounted on the circuit substrate S in a square shape using flip-chip bonding. The MI elements M1 and M3 mounted parallel to the X-axis direction can detect the magnetic field component in the X-axis direction (the one axis direction or first axis direction) (referred simply to as an "X-component") while the MI elements M2 and M4 mounted parallel to the Y-axis direction (second axis direction) can detect the magnetic field component in the Y-axis direction (referred simply to as a "Y-component"). The MI elements M1 to M4 can also detect the magnetic field component in the Z-axis direction (referred simply to as a "Z-component") because the magnetic field deflectors F1 to F4 are disposed on the center lines of respective MI elements.

The MI elements M1 to M4 are in the same form while the magnetic field deflectors F1 to F4 are also in the same form, so the following description will be made representatively for the MI element M1 and the magnetic field deflector F1, and the description for other MI elements M2 to M4 and magnetic field deflectors F2 to F4 will be omitted.

As illustrated in FIG. 2B, the MI element M1 comprises a magneto-sensitive wire W1, a detection coil C1 wound around the magneto-sensitive wire W1, and a set of terminals T1 connected to the magneto-sensitive wire W1 and detection coil C1. The magneto-sensitive wire W1 is composed of an amorphous wire of zero magnetostriction made of a Co—Fe—Si—B-based alloy. The detection coil C1 comprises a left-side coil part C11 and a right-side coil part C12. The left-side coil part C11 and the right-side coil part C12 have the same specs, such as the number of turns, winding diameter, winding direction, and pitch, which affect the magnitude of output, and are formed symmetrically with respect to the center position (point) which the center axis of the magnetic field deflector F1 passes through. The coil parts C11 and C12 and the set of terminals T1 are formed on the circuit substrate S using photolithography. The set of terminals T1 comprises terminals T101 and T102 for supplying a pulse signal to the magneto-sensitive wire W1, terminals T111 and T112 that output the electromotive force (V11) generated in the left-side coil part C11, and terminals T121 and T122 that output the electromotive force (V12) generated in the right-side coil part C12.

The magnetic field deflector F1 comprises a core part F10 that is composed of an insulating resin and has a shape of solid cylinder or frustum of circular cone, a thin film-like shell part F11 that is configured to cover a side circumferential surface F101 and a top surface F102 of the core part F10, and an expanded part F13 that expands at the bottom surface side (side opposite to the top surface F102) of the core part F10. The shell part F11 and the expanded part F13 merge into each other and both are composed of a permalloy (78 mass % Ni—Fe) of a high magnetic permeability ($\mu$=180,000). As illustrated in FIG. 2A, the magnetic field deflector F1 allows the magnetic flux lines of Z-component to change the directions. Specifically, the Z-component is magnetically collected into the expanded part F13 to pass through the circumferential side portion of the shell part F11 and spreads from the top surface portion of the shell part F11 toward the MI element M1 in a radial fashion (evenly to right and left). Thus, the magnetic field deflector F1 deflects the Z-component to the extending direction (X-axis direction) of the magneto-sensitive wire W1 and, as a result, the Z-component can be detected by the MI element M1.

Figure 3:
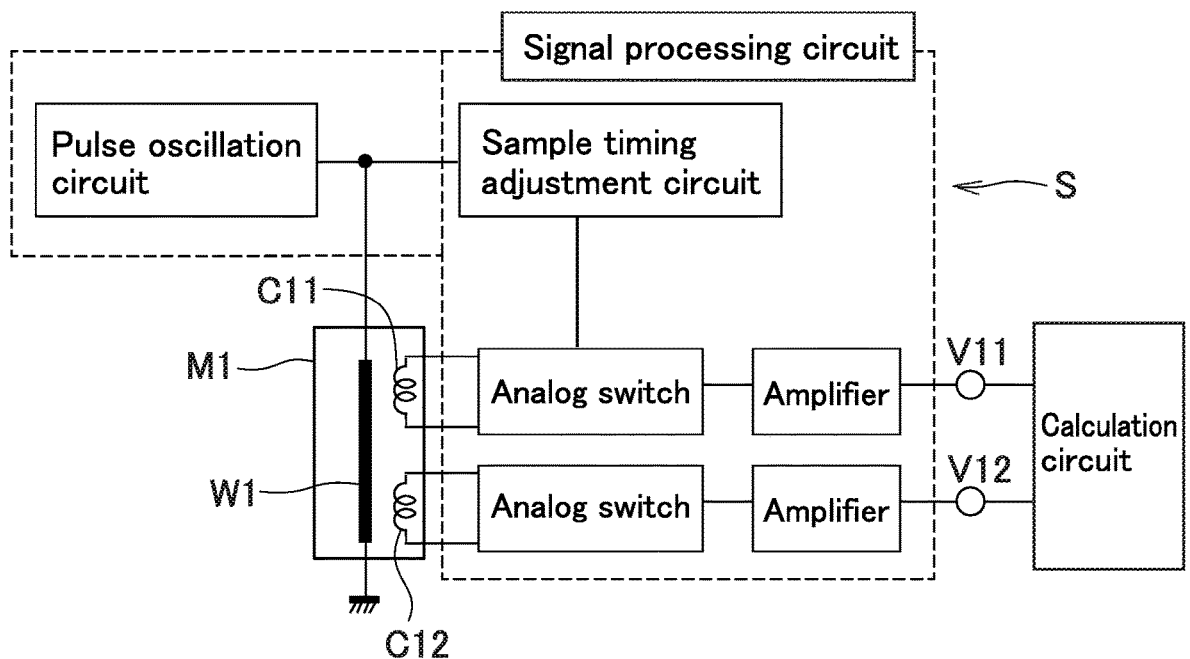
FIG. 3 is a diagram of an electric circuit that drives the MI element.

As illustrated in FIG. 3, the integrated circuit (ASIC) formed in the circuit substrate S comprises a pulse oscillation circuit (drive circuit) that supplies a pulse signal to the magneto-sensitive wire W1, a signal processing circuit that acquires an output (voltage) V11 from the left-side coil part C11 and an output (voltage) V12 from the right-side coil part C12, and a calculation circuit (including a switching circuit).

Figure 4A:
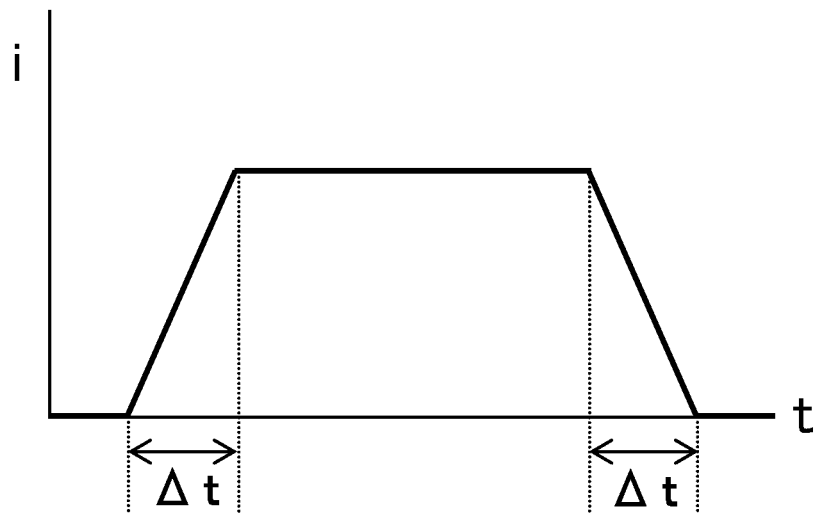
FIG. 4A is a waveform chart illustrating a pulse current waveform to be applied to the MI element.
Figure 4B:
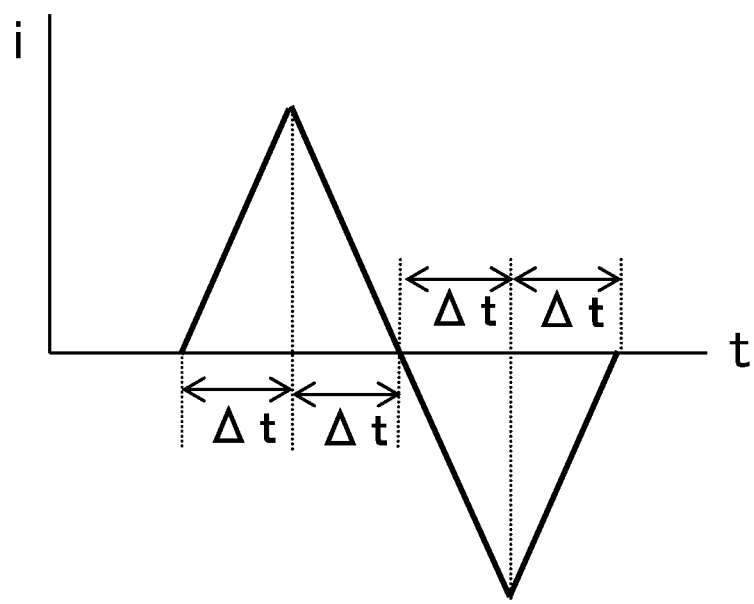
FIG. 4B is a view for explaining a method of obtaining a frequency from rise time and/or fall time of the pulse current waveform.

The pulse oscillation circuit and the signal processing circuit operate as follows. First, a pulse current having a high frequency (e.g. corresponding to 200 MHz) generated by the pulse oscillation circuit is supplied to the magneto-sensitive wire W1. This pulse current causes an interaction between the magnetic field generated in a circumferential direction of the magneto-sensitive wire W1 and the external magnetic field, and the left-side coil part C11 and the right-side coil part C12 each generate a voltage corresponding to the magnetic field component which acts in the axis direction. The frequency as referred to herein is obtained by measuring the "rise" or "fall" time $\Delta t$ of a pulse of the pulse current waveform illustrated in FIG. 4A and assuming that the $\Delta t$ corresponds to one fourth of a period as illustrated in FIG. 4B.

Next, after the above pulse current rises, a sample timing adjustment circuit in the signal processing circuit turns on and off analog switches for a short time at a predetermined timing. This operation allows the analog switches to sample respective voltages generated in the left-side coil part C11 and right-side coil part C12. The sampled voltages are amplified by respective amplifiers and the outputs V11 and V12 are thus obtained. The outputs V11 and V12 can also be obtained by processing when the pulse current is shut off (the pulse current falls) rather than when the pulse current rises.

The calculation circuit alternately calculates the sum and difference of the output V11 and output V12 to provide an output indicative of the X-component (magnetic field component in the one axis direction) of the external magnetic field on the basis of the sum of the output V11 and the output V12 and provide an output indicative of the Z-component (magnetic field component in the other axis direction) of the external magnetic field on the basis of the difference between the output V11 and the output V12. The reason that the sum and difference can provide outputs indicative of the X-component and Z-component will be described below.

<Magnetic Field Detection>

The magnetic field deflector F1 is disposed at the middle of the symmetric left-side coil part C11 and right-side coil part C12 of the MI element M1. Effects on the outputs of the coil parts by the magnetic field deflector F1 are also symmetric. Observation will now be made, for example, to a deflected magnetic field component (measurement magnetic field/magnetic vector H) that is the Z-component of the external magnetic field which is deflected by the magnetic field deflector F1. As previously described, all the specs affecting the magnitude of outputs are the same in the left-side coil part C11 and the right-side coil part C12. Therefore the effect of the X-component in the X-axis direction of the original external magnetic field caused around the MI element M1 is canceled, and the output difference (V11−V12) between the output V11 of the left-side coil part C11 and the output V12 of the right-side coil part C12 reflects only the effect of a further X-component (Hx) of the deflected magnetic field component which acts on the left-side coil part C11 and the right-side coil part C12 in opposite directions. Of course, the Z-component (Hz) of the deflected magnetic field component does not affect the above output difference because the magneto-sensitive wire W1 does not sense the Z-component (Hz). The Z-component of the original external magnetic field can thus be obtained from the output difference through calculation of multiplying the output difference by an appropriate coefficient.

In the output sum (V11+V12) of the output V11 and output V12, the effect of the X-component (Hx) of the deflected magnetic field component is canceled, and the Z-component (Hz) of the deflected magnetic field component also does not affect the output sum as described above. Therefore the output sum reflects only the effect of a further X-component (projection component in the X-axis direction) of the magnetic field component which is caused due to the X-component of the original external magnetic field being deflected by the magnetic field deflector F1. The X-component of the original external magnetic field can thus be obtained from the output sum through calculation of multiplying the output sum by an appropriate coefficient. Such situations are the same in the MI element M3. The Y-component and the Z-component can also be detected using the MI element M2 and the MI element M4 in a similar manner to the above.

It is preferred that the component of each axis direction of the external magnetic field be calculated on the basis of an average value (e.g. arithmetic average) of outputs from a plurality of MI elements rather than merely on the basis of an output from one MI element. As will be understood, the output value can be coupled with an appropriate correction coefficient and/or an appropriate correction term in consideration of the shape of the magnetic field deflector, the arrangement and characteristics of the MI element, and other factors. Such arithmetic processing may be executed on the above-described calculation circuit or may also be executed using a program for an information terminal or the like to be equipped with the MI sensor 1. Basic idea as for the arithmetic processing is also described in detail in WO2010/110456, etc.

<Method of Manufacturing>

Figure 5:
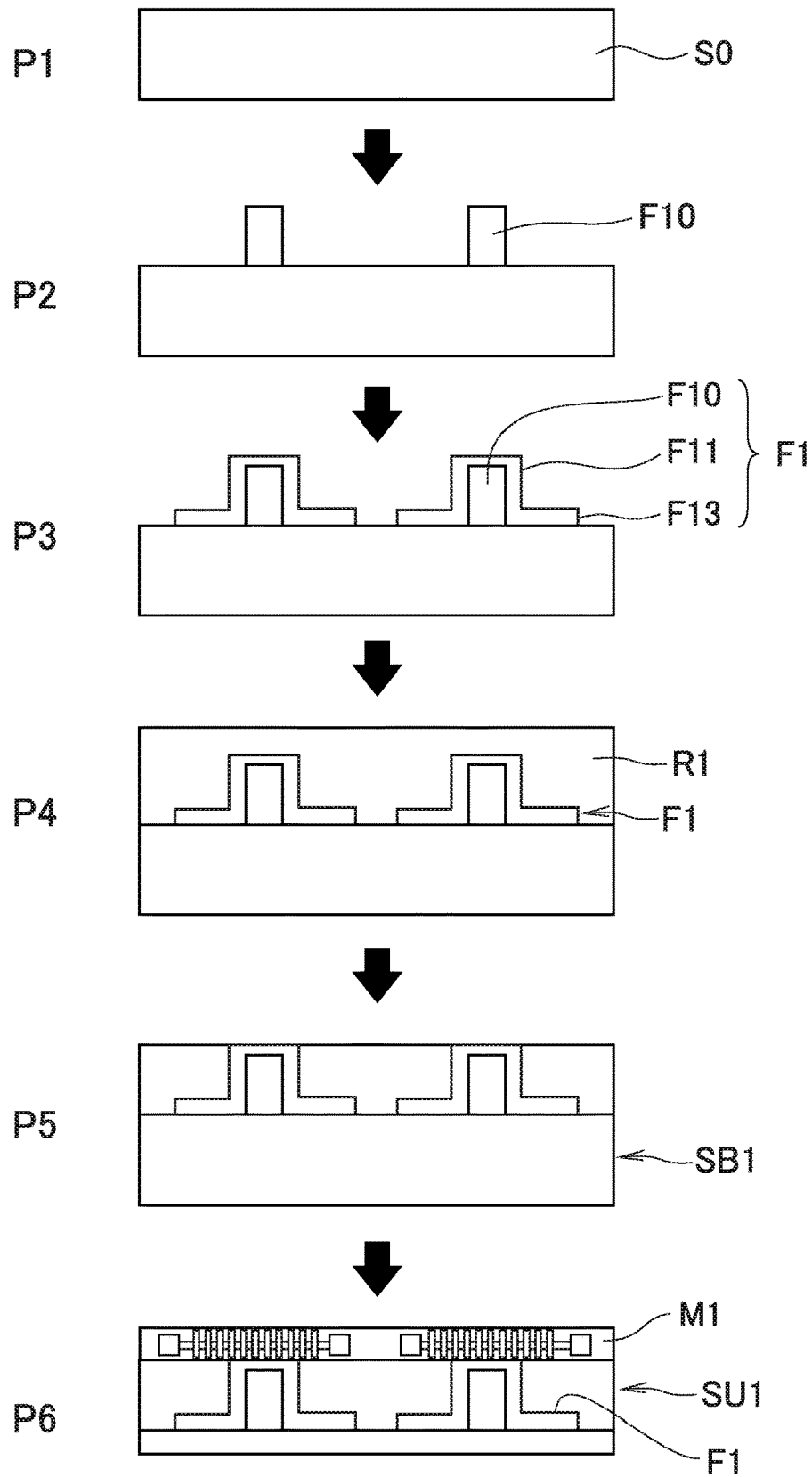
FIG. 5 is a view for explaining a process of manufacturing the MI sensor.

The circuit substrate S in which magnetic field deflectors F1 are embedded is manufactured, for example, through processes as illustrated in FIG. 5. Specifically, first, a base substrate 50 is prepared which is formed with a number of integrated circuits each comprising the above-described pulse oscillation circuit, signal processing circuit, and calculation circuit in a silicon wafer (process P1).

Insulating resin posts to be core parts F10 are formed on the base substrate 50 (process P2). Permalloy plating layers to be expanded parts F13 and shell parts F11 are formed on the core parts F10 (process P3). The process of forming these plating layers (plating process) is also performed using photolithography. This plating process may be followed by heat treatment (annealing) to remove small inner stresses (or inner strains) caused in the expanded parts F13 and shell parts F11 thus formed.

An insulating resin layer R1 surrounding the magnetic field deflectors F1 formed on the base substrate 50 is formed by resin molding (process P4). The upper end surface of the insulating resin layer R1 is polished to be flat (process P5). After the polishing, plating of permalloy may be further performed to adjust the film thickness at the top surface side (upper end surface side) of the shell parts F11. An embedding base substrate SB1 is thus obtained in which the magnetic field deflectors F1 are embedded.

MI elements M1 are mounted on the embedding base substrate SB1, such as using flip-chip bonding (process P6/mounting process). Thereafter, the other surface side of the embedding base substrate SB1 is subjected to polishing (backgrinding), etc. A united base substrate SU1 is thus obtained. By dicing this united base substrate SU1 (dividing process), a number of MI sensors 1 can be obtained. Each MI sensor may be formed on the surface of the embedding base substrate SB1 or the like using a method as described in detail in WO2014/054371, etc.

Second Example

Figure 6A:
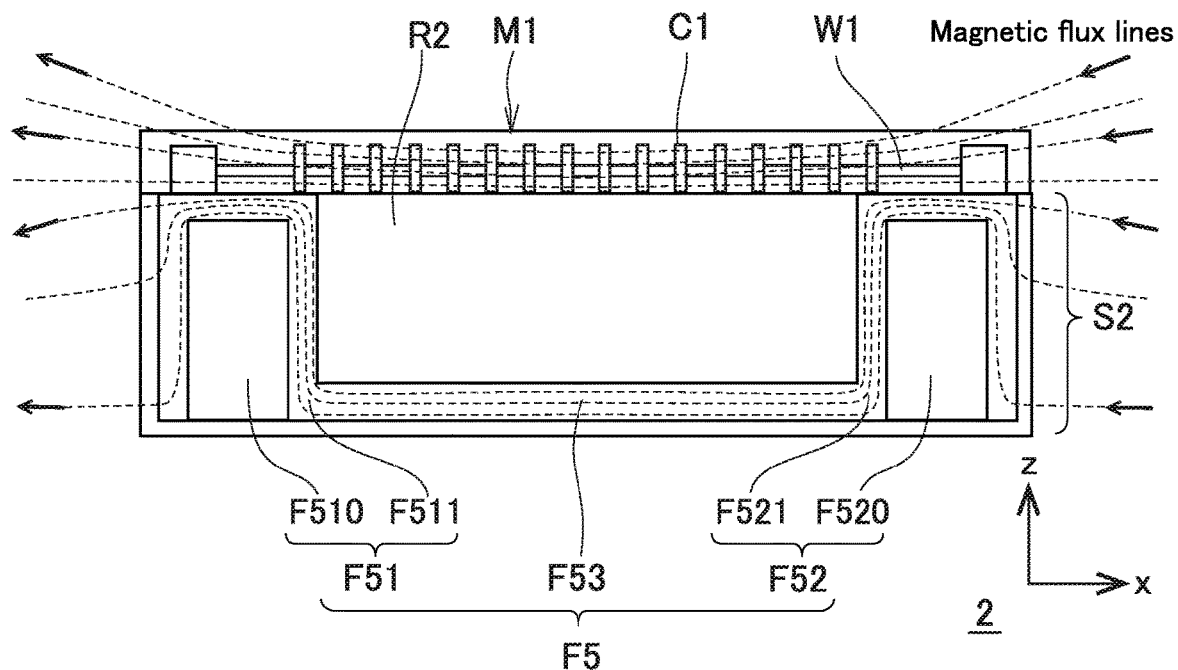
FIG. 6A is a view illustrating a cross section of an MI sensor according to a second example and magnetic flux lines acting in the extending direction (X-direction) of a magneto-sensitive wire.
Figure 6B:
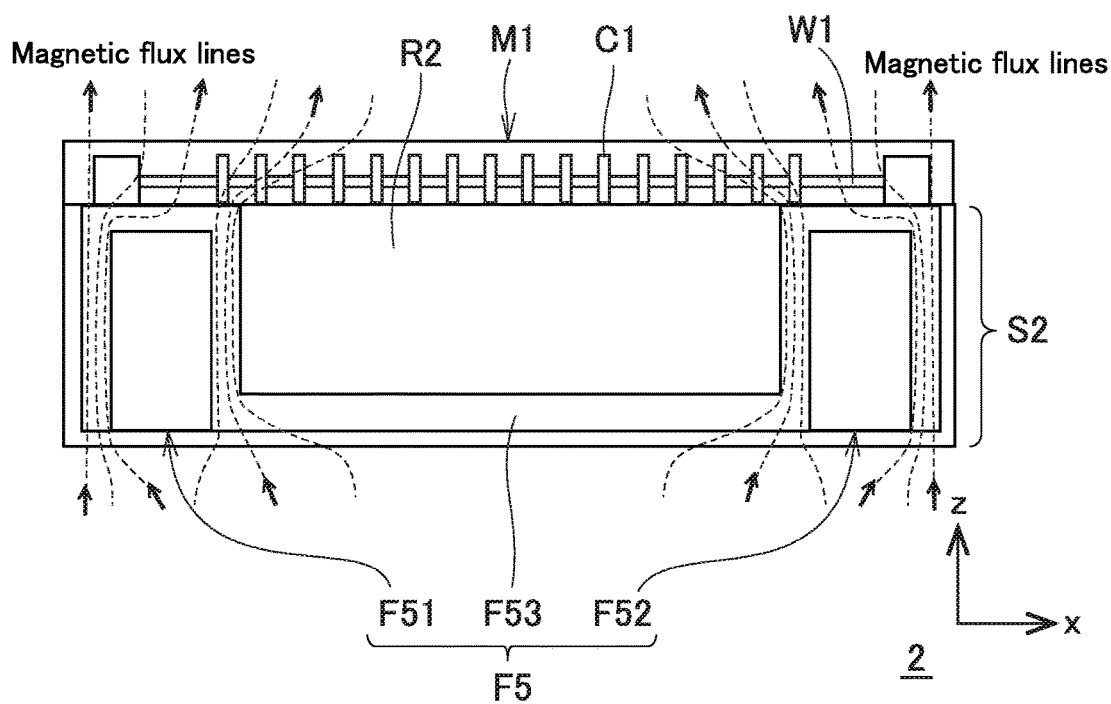
FIG. 6B is a cross-sectional view illustrating magnetic flux lines acting in the orthogonal direction (Z-direction) to the magneto-sensitive wire.

FIG. 6A and FIG. 6B each illustrate a cross-sectional view of an MI sensor 2 as a second example. FIG. 6C is a perspective view schematically illustrating the arrangement relationship of a magneto-sensitive wire W1, a detection coil C1, and a magnetic field deflector F5 that are substantial parts of the MI sensor 2. FIG. 6A to FIG. 6C may be collectively referred to as FIG. 6. Similar members or portions to those in the case of the first example are denoted by the same reference characters and the description of these members will be omitted.

The magnetic field deflector F5 has a plate-like bridging part F53 (expanded part or magnetism collecting part), a rectangular column-like left-side deflecting part F51 that stands perpendicularly from the left end part of the bridging part F53, and a rectangular column-like right-side deflecting part F52 that stands perpendicularly from the right end part of the bridging part F53. The left-side deflecting part F51 comprises a core part F510 and a thin film-like shell part F511 that covers a top surface and a side circumferential surface of the core part F510. The shell part F511 and the bridging part F53 merge into each other at the bottom surface side of the core part F510. The right-side deflecting part F52 comprises a core part F520 and a thin film-like shell part F521 that covers a top surface and a side circumferential surface of the core part F520. The shell part F521 and the bridging part F53 also merge into each other at the bottom surface side of the core part F520. The shell part F511, the shell part F521, and the bridging part F53 are composed of the previously-described soft magnetic material (permalloy). The core part F510 and the core part F520 are composed of the previously-described insulating resin.

The external magnetic field acting on the MI element M1 is deflected by the magnetic field deflector F5 as the magnetic flux lines illustrated in FIG. 6A and FIG. 6B. Specifically, as illustrated in FIG. 6A, only a part of the external magnetic field component (extending component) in the extending direction (X-direction) of the magneto-sensitive wire W1 is introduced into the magneto-sensitive wire W1 while a large part thereof circumvents the magneto-sensitive wire W1 via the bridging part F53 and the left-side deflecting part F51.

On the other hand, as illustrated in FIG. 6B, the external magnetic field component (orthogonal component) in the orthogonal direction (Z-direction) to the magneto-sensitive wire W1 is magnetically collected by the bridging part F53, then branched into the left-side deflecting part F51 and the right-side deflecting part F52, and introduced into the magneto-sensitive wire W1 from the upper end surface side of the left-side deflecting part F51 and the right-side deflecting part F52 (opposite surface side to the bridging part F53). Then, the MI element M1 detects a part of the orthogonal component which is deflected to the extending direction of the magneto-sensitive wire W1.

The left-side deflecting part F51 and the right-side deflecting part F52 are arranged symmetrically with respect to the middle of the magneto-sensitive wire W1 and have symmetric shapes of the same size. According to this arrangement, deflected respective components of the orthogonal component introduced into the magneto-sensitive wire W1 via the left-side deflecting part F51 and the right-side deflecting part F52 are also symmetric (in opposite directions and having equal magnitudes).

Thus, also in this example, the X-component of the external magnetic field can be detected on the basis of the sum of the output V11 and output V12 obtained from the MI element M1 while the Z-component of the external magnetic field can be detected on the basis of the difference between the output V11 and output V12, as in the case of the first example. In the case of this example, however, a part of the extending component of the original external magnetic field and a part of the orthogonal component of the original external magnetic field are deflected by the magnetic field deflector F5 and introduced into the magneto-sensitive wire W1. The level difference is therefore small between the outputs obtained by the left-side coil part C11 and the right-side coil part C12 (difference between V11+V12 and V11−V12 is small). As a result, according to the MI sensor 2 of this example, both the extending component and the orthogonal component of the external magnetic field can be measured with appropriate sensitivity in a wide range.

Third Example

Figure 7A:
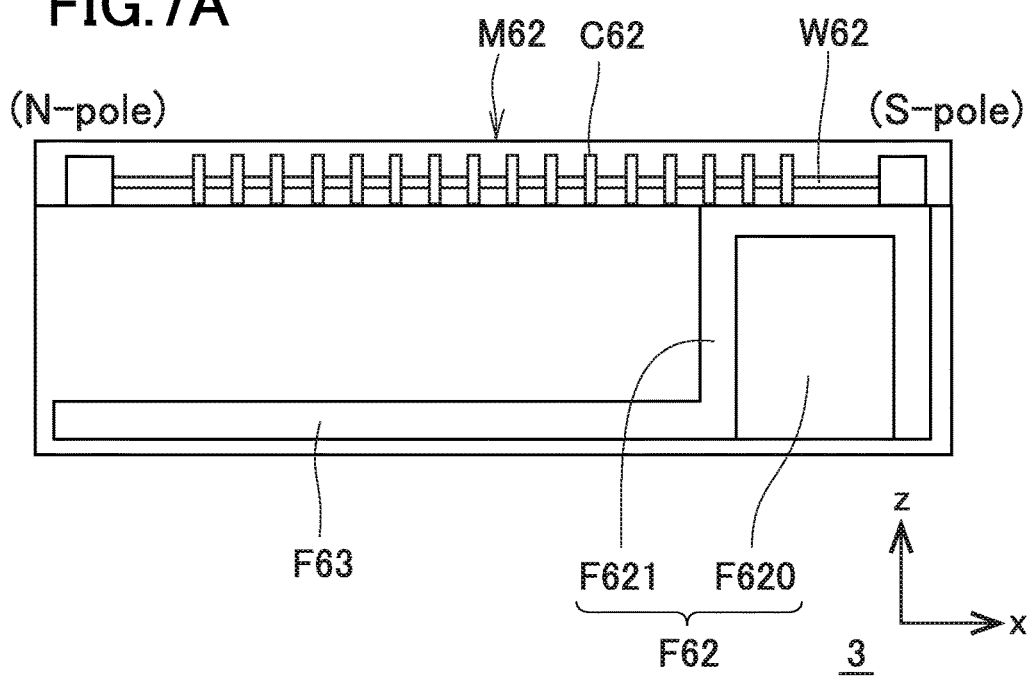
FIG. 7A is a cross-sectional view of an MI sensor according to a third example.
Figure 7B:
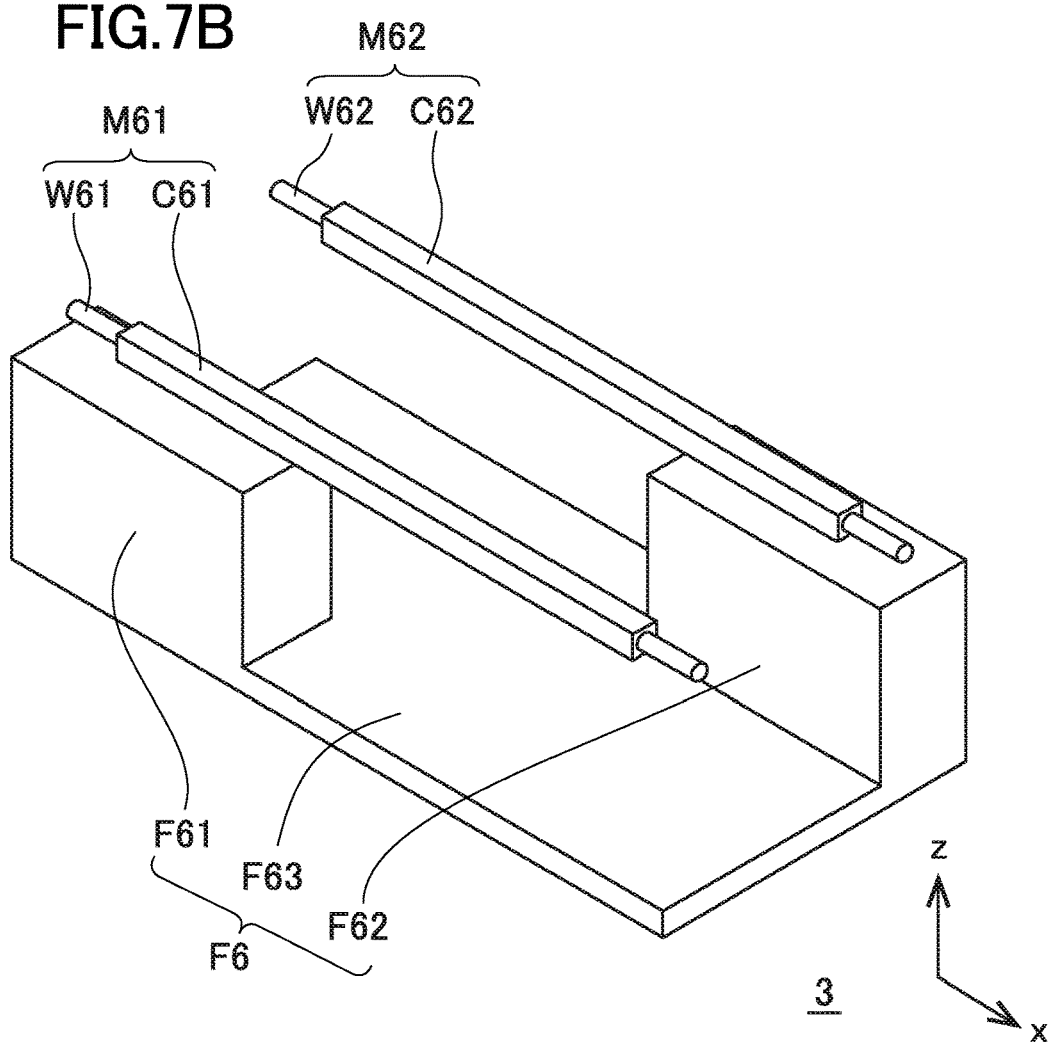
FIG. 7B is a perspective view schematically illustrating substantial parts of the MI sensor.

FIG. 7A illustrates a cross-sectional view of an MI sensor 3 as a third example. FIG. 7B is a perspective view schematically illustrating the arrangement relationship of magneto-sensitive wires W61 and W62, detection coils C61 and C62, and a magnetic field deflector F6 that are substantial parts of the MI sensor 3. FIG. 7A and FIG. 7B may be collectively referred to as FIG. 7.

The MI sensor 3 is modified from the MI sensor 2 such that the magnetic field deflector F5 is substituted by a magnetic field deflector F6 and the MI element M1 is substituted by MI elements M61 and M62. The MI element M61 has a magneto-sensitive wire W61 and a detection coil C61 wound around the magneto-sensitive wire W61 while the MI element M62 has a magneto-sensitive wire W62 and a detection coil C62 wound around the magneto-sensitive wire W62. The detection coil C61 and the detection coil C62 correspond respectively to the left-side coil part C11 and the right-side coil part C12 of the MI element M1, but are not divided in the middle and are independently formed around the magneto-sensitive wire W61 and the magneto-sensitive wire W62, respectively.

The magnetic field deflector F6 has a plate-like bridging body F63 (expanded part or magnetism collecting part), a rectangular column-like first deflecting body F61 that stands perpendicularly from the left end corner part of the bridging body F63, and a rectangular column-like second deflecting body F62 that stands perpendicularly from the right end corner part of the bridging body F63. The first deflecting body F61 comprises a core part F610 (not illustrated) and a thin film-like shell part F611 (not illustrated) that covers a top surface and a side circumferential surface of the core part F610. The shell part F611 and the bridging body F63 merge into each other at the bottom surface side of the core part F610. The second deflecting body F62 comprises a core part F620 and a thin film-like shell part F621 that covers a top surface and a side circumferential surface of the core part F620. The shell part F621 and the bridging body F63 also merge into each other at the bottom surface side of the core part F620. The shell part F611, the shell part F621, and the bridging body F63 are composed of the previously-described soft magnetic material (permalloy). The core part F610 and the core part F620 are composed of the previously-described insulating resin.

The external magnetic field distribution (magnetic flux lines) around the magneto-sensitive wires W61 and W62 is deflected by the magnetic field deflector F6, but the form of deflection is different to some extent from the case of the magnetic field deflector F5. Specifically, first, the external magnetic field component (extending component) in the extending direction (X-direction) of the magneto-sensitive wires W61 and W62 is deflected and a part thereof is introduced into the magneto-sensitive wires W61 and W62. Then, the external magnetic field component (orthogonal component) in the orthogonal direction (Z-direction) is magnetically collected by the bridging body F63, branched (converged) into the first deflecting body F61 and the second deflecting body F62, and deflected toward the middle of the magneto-sensitive wires W61 and W62 from the upper end surface side of the first deflecting body F61 and the second deflecting body F62. A further part (Hx) of the deflected magnetic field component (H) is introduced into the magneto-sensitive wires W61 and W62.

In the case of this example, the first deflecting body F61 and the second deflecting body F62 are respectively disposed only at one end side of the magneto-sensitive wire W61 and at one end side of the magneto-sensitive wire W62. Due to this arrangement, for example, one end side of the magneto-sensitive wire W62 is formed with the S-pole while the other end side is formed with the N-pole as illustrated in FIG. 7A, and no magnetic poles are formed in the middle of the magneto-sensitive wire W62. Thus, the distance between magnetic poles formed on the magneto-sensitive wire W62 is long. In contrast, when the left-side deflecting part F51 and the right-side deflecting part F52 are present at both ends of the magneto-sensitive wire W1 as in the MI sensor 2, for example, both ends of the magneto-sensitive wire W1 are formed with S-poles while the middle of the magneto-sensitive wire W1 are formed with N-poles, and the distance between magnetic poles is short.

The MI sensor 3 is therefore less likely to be affected by the demagnetizing field acting on the magneto-sensitive wires W61 and W62 and tends to have higher sensitivity than the MI sensor 2. Moreover, the MI sensor 3 has a set in which a pair of the magneto-sensitive wire and the detection coil and another pair of the magneto-sensitive wire and the detection coil are provided side by side, and can measure the external magnetic field with higher sensitivity.

The MI element M61 and the first deflecting body F61, and the MI element M62 and the second deflecting body F62, are in a symmetric arrangement and symmetric form around the center axis of the bridging body F63. The MI sensor 3 can therefore detect the extending component and orthogonal component of the external magnetic field using the calculation method as in the case of the MI sensor 2.

DESCRIPTION OF REFERENCE NUMERALS

1: MI sensor (Magnetic detection device)
M1: MI element
W1: Magneto-sensitive wire
C1: Detection coil
C11: Left-side coil part
C12: Right-side coil part
F1: Magnetic field deflector
F10: Core part
F11: Shell part
S: Circuit substrate (Substrate)

The invention claimed is:
1. A magnetic detection device comprising:
a substrate;
a magneto-impedance element (referred to as an "MI element") disposed on the substrate and comprising a magneto-sensitive wire and a detection coil, the magneto-sensitive wire sensing an external magnetic field component in an extending direction, the detection coil looping around the magneto-sensitive wire; and
a magnetic field deflector of which at least a part is disposed on the substrate or in the substrate, the magnetic field deflector deflecting an external magnetic field around the magneto-sensitive wire,
the magnetic field deflector comprising:
a core part composed of a nonmagnetic material and having a column-like shape or circular cone-like shape extending in the direction orthogonal to the magneto-sensitive wire; and
a shell part composed of a soft magnetic material, the shell part covering an outer side of at least a part of the core part and at least a part of the shell part being formed on a top surface of the core part as an end surface at the magneto-sensitive wire side.
2. The magnetic detection device as recited in claim 1, wherein
the detection coil comprises a left-side coil part and a right-side coil part that coexist along the magneto-sensitive wire; and
the magnetic field deflector is disposed on a middle of the left-side coil part and the right-side coil part.
3. The magnetic detection device as recited in claim 1, wherein
the detection coil comprises a left-side coil part and a right-side coil part that coexist along the magneto-sensitive wire; and the magnetic field deflector comprises a left-side deflecting part disposed near the left-side coil part side and a right-side deflecting part disposed near the right-side coil part side.

4. The magnetic detection device as recited in claim 1, wherein the magneto-sensitive wire comprises a first wire and a second wire that are disposed parallel to each other, the detection coil comprises a first coil that loops around the first wire and a second coil that loops around the second wire, and the magnetic field deflector comprises a first deflecting body disposed near one end part side of the first wire and a second deflecting body disposed near other end part side of the second wire.

5. The magnetic detection device as recited in claim 1, wherein shell parts of the magnetic field deflector are formed symmetrically with respect to one or more MI elements.

\* \* \* \* \*